(12) United States Patent
Alami et al.

(10) Patent No.: US 7,684,244 B2
(45) Date of Patent: Mar. 23, 2010

(54) HIGH DENSITY NON-VOLATILE MEMORY ARRAY

(75) Inventors: Salwa Bouzekri Alami, Aix en Provence (FR); Arnaud Turier, Chateauneuf le Rouge (FR); Lotfi Ben Ammar, Marseilles (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/749,428

(22) Filed: May 16, 2007

(65) Prior Publication Data

US 2008/0285326 A1    Nov. 20, 2008

(51) Int. Cl.
*G11C 16/04* (2006.01)
(52) U.S. Cl. .................................. 365/185.17
(58) Field of Classification Search ............ 365/185.17, 365/185.28, 185.2
See application file for complete search history.

(56) References Cited

U.S. PATENT DOCUMENTS

| | | | |
|---|---|---|---|
| 4,208,726 A | 6/1980 | McElroy | |
| 4,336,647 A | 6/1982 | McElroy | |
| 4,406,049 A | 9/1983 | Tam et al. | |
| 4,493,057 A | 1/1985 | McElroy | |
| 4,888,735 A | 12/1989 | Lee et al. | |
| 5,027,321 A | 6/1991 | Park | |
| 5,793,078 A | 8/1998 | Takeuchi | |
| 5,804,484 A | 9/1998 | Wen | |
| 5,811,337 A | 9/1998 | Wen | |
| 5,834,819 A | 11/1998 | Wen | |
| 5,917,224 A | 6/1999 | Zangara | |
| 6,137,720 A | 10/2000 | Lancaster | |
| 6,618,282 B1 | 9/2003 | Poplevine et al. | |
| 6,689,663 B1 | 2/2004 | Chang et al. | |
| 6,747,889 B2 | 6/2004 | Derner et al. | |
| 6,822,889 B2 | 11/2004 | Chen et al. | |
| 6,826,070 B2 | 11/2004 | Sung et al. | |
| 6,853,586 B2 | 2/2005 | Choy et al. | |
| 6,875,659 B2 | 4/2005 | Yang et al. | |
| 6,885,600 B2 | 4/2005 | Tran et al. | |
| 6,903,957 B2 | 6/2005 | Derner et al. | |
| 6,914,819 B2 * | 7/2005 | Yeh et al. ................ | 365/185.18 |

(Continued)

FOREIGN PATENT DOCUMENTS

EP    0601207 A1    6/1994

(Continued)

OTHER PUBLICATIONS

"U.S. Appl. No. 11/749,428, filed Jul. 18, 2008 Response to Restriction Requirement Mailed Jun. 18, 2008", 6.

(Continued)

*Primary Examiner*—Hoai V Ho
*Assistant Examiner*—Anthan T Tran
(74) *Attorney, Agent, or Firm*—Schwegman, Lundberg & Woessner, P.A.

(57) ABSTRACT

A high-density non-volatile memory array. In one aspect of the invention, a memory array circuit includes a plurality of word lines, a plurality of bit-lines, and a plurality of memory cell transistors. The gate of each memory cell transistor is connected to one of the word lines, and the drains and sources of each memory cell transistor are connected only to the bit-lines.

13 Claims, 12 Drawing Sheets

U.S. PATENT DOCUMENTS

| | | |
|---|---|---|
| 6,956,779 B2 | 10/2005 | Tran |
| 6,975,539 B2 | 12/2005 | Tran |
| 7,002,827 B1 * | 2/2006 | Sabharwal et al. ............ 365/94 |
| 7,009,880 B1 | 3/2006 | Liu |
| 7,120,063 B1 * | 10/2006 | Liu et al. ............... 365/185.24 |
| 7,327,593 B2 | 2/2008 | Ostermayr et al. |
| 7,420,860 B2 * | 9/2008 | Yamada et al. ............... 365/201 |
| 2002/0015332 A1 | 2/2002 | Rolandi et al. |
| 2002/0190749 A1 | 12/2002 | Sun et al. |
| 2003/0023945 A1 | 1/2003 | Wnag et al. |
| 2003/0117845 A1 | 6/2003 | Yamauchi |
| 2004/0033670 A1 | 2/2004 | Yang et al. |
| 2004/0109356 A1 | 6/2004 | Choy et al. |
| 2004/0120193 A1 * | 6/2004 | Nakaya .................. 365/189.11 |
| 2005/0151205 A1 | 7/2005 | Taniguchi et al. |
| 2006/0239059 A1 | 10/2006 | Murata |
| 2008/0170430 A1 | 7/2008 | Miller et al. |

FOREIGN PATENT DOCUMENTS

| | | |
|---|---|---|
| EP | 1612806 A2 | 1/2006 |
| WO | WO-2006138742 A1 | 12/2006 |
| WO | WO-2008143934 A1 | 11/2008 |

OTHER PUBLICATIONS

"International Application Serial No. PCT/US2008/006235, International Search Report and Written Opinion mailed Aug. 29, 2008", P220.

* cited by examiner

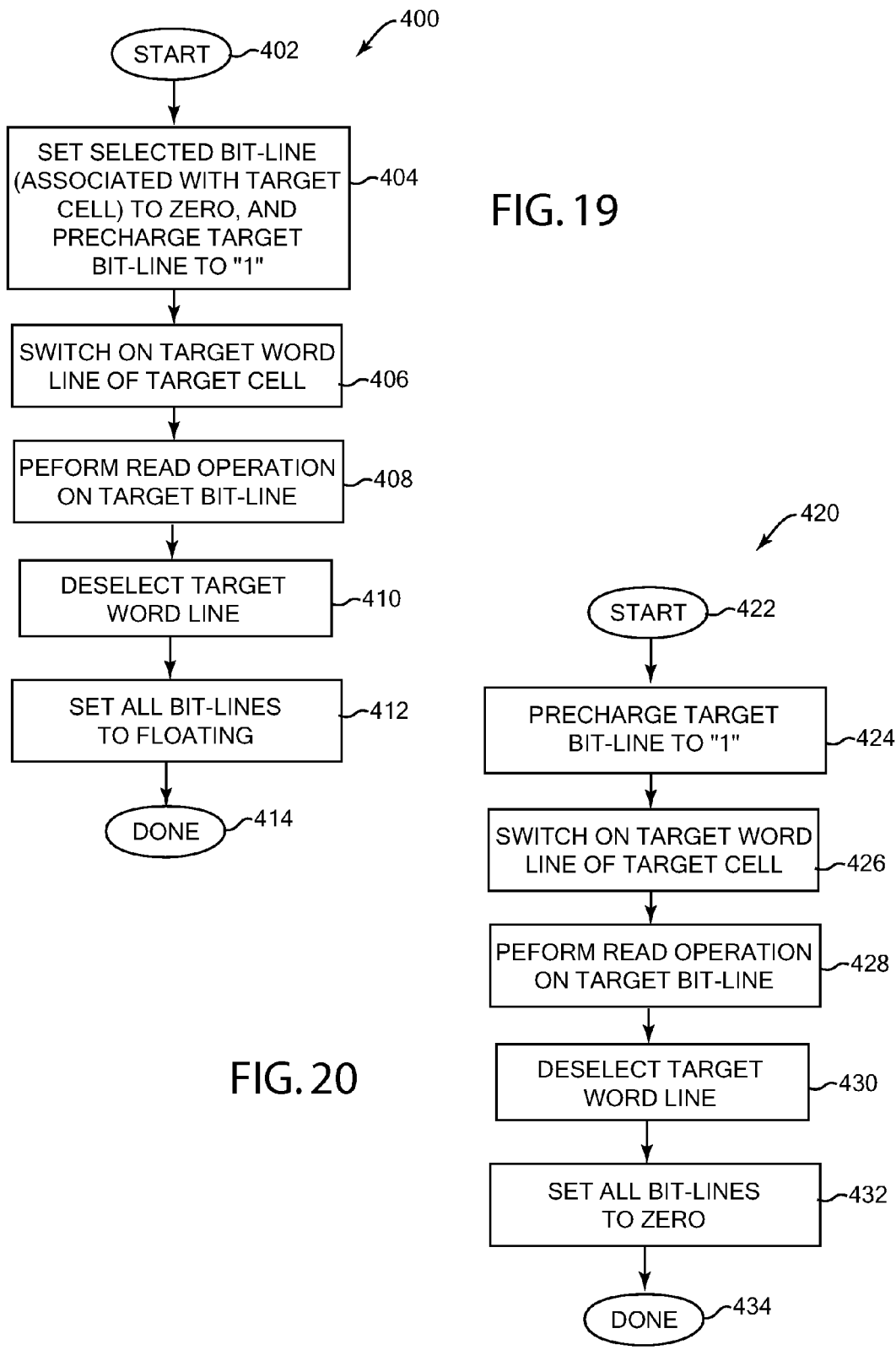

HIGH DENSITY NON-VOLATILE MEMORY ARRAY

FIELD OF THE INVENTION

The present invention relates to memory for electronic devices, and more particularly to high density non-volatile memory arrays.

BACKGROUND OF THE INVENTION

High density non-volatile memory arrays are used to store digital data for computer systems and other electronic devices. In such memory arrays, reference lines are used in addition to bit-lines and word lines to store digital data through selection transistors of the array and to access the data during read operations. Active/diffusion is typically used to connect the selection transistors to such reference lines. For example, FIG. 1 is a schematic illustration of a classical read-only memory (ROM) cell 10, including a reference line 12 to ground.

With dimensions of transistors continually decreasing in new products and devices, the resistance of such active/diffusion reference lines is increasing significantly. A resulting undesired voltage drop between the reference line and the selection transistor is therefore also increasing, and the operation margins in which a correct read operation can be performed are drastically reduced. Also, supply voltages are decreasing, further reducing the read margins of the memory array. This makes the reading scheme in memory arrays more critical, since there is a greater risk of read failures.

Current designs deal with these potential read operation problems in various ways. A ROM cell typically uses an NMOS or PMOS transistor. As shown in the schematic illustration of a memory cell transistor 14 of FIG. 2, each memory cell transistor has a word line (row) 16, a bit-line (column) 18, and a reference line (rl) 20. The word line 16 connects all the gates of all the transistors on the same row of the array. The bit-line 18 connects all the drains (or the sources) of all the transistors on the same column of the array. The reference line 20 is common to several cells and is connected to the source (or the drain) of each transistor.

Table 1 provides an example of content of a memory having 5 word lines (Li−2, . . . , Li+2) and 5 bit-lines (Bj−2, . . . , Bj+2). This memory content is used as an example for all the memory array embodiments described herein.

TABLE 1

| Content of the cell | Bj − 2 | Bj − 1 | Bj | Bj + 1 | Bj + 2 |
|---|---|---|---|---|---|
| Li + 2 | 0 | 1 | 1 | 0 | 1 |
| Li + 1 | 0 | 1 | 0 | 0 | 1 |
| Li | 1 | 0 | 1 | 0 | 0 |
| Li − 1 | 0 | 0 | 1 | 1 | 0 |
| Li − 2 | 1 | 0 | 1 | 1 | 1 |

A reference line can be implemented either horizontally or vertically relative to the rows and columns of the memory array. FIG. 3 is a schematic illustration of a ROM array 30 having horizontal reference lines 32 parallel to horizontal word lines 33. In the memory array example 30, each horizontal word line 33 and vertical bit-line 36 intersect at a memory cell transistor 34, where disconnected inactive transistors provide a "1" value, and active transistors having connected source and drain terminals provide a "0" value. Each two adjacent cells 34 share the same reference line 32. Thus, one extra line is required for use as the reference line, for every two rows of transistors. A bit-line 36 is connected to the source (or the drain) of a cell transistor if the content is "0", or the bit-line 36 is not connected to the cell transistor if the content of the cell is "1."

In the embodiment of FIG. 3, the reference lines 32 can be implemented as active/diffusion lines or as metal lines. When using active/diffusion reference lines, additional columns are regularly inserted in the array to connect an active/diffusion reference line to a vertical metal reference line in order to reduce the active/diffusion resistance in the line. This solution, however, increases the area of the memory array. Metal reference lines can alternatively be used, which reduce the voltage drop across the reference lines, but still increase the area of the cell due to the more restrictive design rules required by metal lines.

Vertical metal reference lines can be used generally in two different designs. FIG. 4 is a schematic diagram of one example of a prior art classical design, an array 40 having vertical bit-lines 44 and reference lines 42. Each cell transistor of one word line i shares its drain (and/or source) with the cell transistor on the next adjacent word line i+1 and/or i−1. To program a "0" in the array, the source and drain of a cell are connected between the target bit-line 44 to be read and an adjacent reference line 42. To program a "1" in the array, the source and drain of the cell are connected together on the target bit-line 44 to be read or to an adjacent reference line 42, depending on the last programmed cell (i.e., the line 42 or 44 connected to is the same line to which the tied source or drain of the last adjacent programmed cell is connected). This design reduces the voltage drop of the reference lines 42 but considerably increases the area of the cell, as there is one additional reference line 42 for each bit-line 44.

A second design of a memory array having vertical reference lines can also be used. One example of the second design is described in U.S. Pat. No. 5,917,224, and is illustrated in the schematic diagram of FIG. 5 as array 60. Each reference line 62 is shared between two different bit-lines 64. As in the classical design, each cell transistor of one word line i shares its drain (and/or source) with the cell transistor on the next adjacent word line i+1 and/or i−1. To program a "0" in the array, the source and drain of a cell are connected between the target bit-line 64 to be read and an adjacent reference line 62. To program a "1" in the array, the source and drain of the cell are connected together on the target bit-line 64 to be read or to an adjacent reference line 62, depending on the last adjacent programmed cell. This approach reduces the voltage drop of the reference lines, but increases the area of the cell, as there is still n/2 more reference lines 62 for each n bit-lines.

Accordingly, a high-density non-volatile memory array allowing more robust reading operations than existing designs while having the same or reduced physical area would be desirable in many applications.

SUMMARY OF THE INVENTION

The invention of the present application relates to high-density non-volatile memory arrays. In one aspect of the invention, a memory array circuit includes a plurality of word lines, a plurality of bit-lines, and a plurality of memory cell transistors. The gate of each memory cell transistor is connected to one of the word lines, and the drains and sources of each memory cell transistor are connected only to the bit-lines.

In another aspect of the invention, a memory array circuit includes a plurality of word lines, a plurality of bit-lines, and a plurality of memory cell transistors arranged in rows and columns. The gates of the memory cell transistors in each row are connected to a different one of the word lines, and the drains and sources of the memory cell transistors in each column are connected only to the bit-lines associated with that column.

In another aspect of the invention, a method for reading a memory cell array includes setting the voltage on one or more bit-lines and a word line of the memory cell array, the bit-lines and the word line being associated with a target cell to be read in a plurality of memory cells of the memory cell array. The voltage level or the current on one of the bit-lines associated with the target cell is read, where the voltage level is read as a value stored in the target memory cell. The reading is performed without setting a voltage on any reference lines of the memory array. A similar aspect of the invention is provided for a computer readable medium including program instructions for implementing similar features.

The present invention provides a high density and robust non-volatile memory array which includes no additional reference lines, since all the column lines (except one) are actual bit-lines for reading data. Active/diffusion resistances are eliminated using connections to existing bit lines instead of separate reference lines. The elimination of separate reference lines allows the area occupied by the memory array to be reduced considerably and/or a higher density memory array to be implemented. Furthermore, the memory array has low leakage, since there are no dedicated reference lines and the bit-lines are set to the same potential or are all floating during the stand by mode.

BRIEF DESCRIPTION OF THE FIGURES

FIG. 19 is a flow diagram illustrating a method of reading data stored in the memory array of FIG. 14 when bit-lines are floating;

FIG. 20 is a flow diagram illustrating a method of reading data stored in the memory array of FIG. 14 when bit lines are precharged to zero voltage;

DETAILED DESCRIPTION

The present invention relates to memory for electronic devices, and more particularly to high density non-volatile memory arrays. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular circuits provided in particular implementations. However, one of ordinary skill in the art will readily recognize that this circuit will operate effectively in other implementations and applications.

To more particularly describe the features of the present invention, please refer to FIGS. 6-23 in conjunction with the discussion below.

Figure 6:
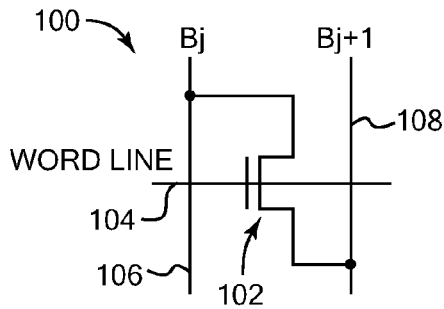
FIG. 6 is a schematic view of a memory cell configuration in a memory array of the present invention used to program a zero value.

FIG. 6 is a schematic view of a memory cell configuration 100 in a memory array of the present invention used to program a zero value. The memory cell is included in a circuit architecture for providing multiple memory cells, such as a non-volatile memory. For example, the cell can be included in a ROM, Erasable Programmable Read-Only Memory (EPROM), FLASH memory, etc. The cells of the present invention, such as the cell in cell configuration 100, can include NMOS or PMOS transistors. The cells of the invention as described herein are generally NMOS transistors. In alternate embodiments, other types of transistors can be used in the circuit. For example, PNP transistors can be used instead of PMOS and NPN transistors instead of NMOS.

Cell configuration 100 is shown in an example configuration that programs a 0 value in a memory array. A transistor (cell) 102 is provided, with a word line 104 connected to the gate of the transistor 102 (and to the gates of other transistors in the same row, so that the word line 104 extends to the left and right of the transistor 102). The source and drain of the cell 102 are connected between the target bit-line 106 to be read, here Bj, and a bit-line 108 on the right side of the cell 102 in FIG. 6, and shown as bit line Bj+1. For example, the source of cell 102 is connected to bit line Bj and the drain of cell 102 is connected to bit-line Bj+1. Bit-line 108 is associated with the cell 102, which in this example means that it is the bit-line adjacent to the right side of cell 102. In other embodiments of configuration 100 (and all the configurations of the present invention described herein), the target bit-line and/or non-target connected bit-line (such as bit-line 108) connected to a target cell can be associated with the target cell without positional adjacency.

In the present invention, there is no need for a connection to a reference line in the cell configuration 100, as shown in FIG. 6. Adjacent cells in the memory array are merged, since they share their sources and drains. With no reference lines needed, the area of the memory array can be reduced significantly.

Figure 7:
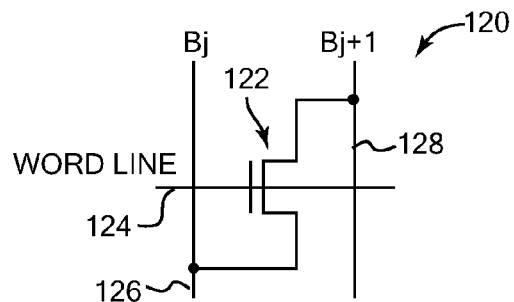
FIG. 7 is a schematic view of a second cell configuration of a memory array of the present invention used to program a zero value.

FIG. 7 is a schematic view of an alternate cell configuration 120 of a memory array of the present invention used to program a zero value. A transistor 122 has a word line 124 connected to the gate of the transistor 122. The source and drain of the cell 122 are connected between the target bit-line 126 to be read, Bj, and the adjacent bit-line 128 on the right side of the cell 120 in FIG. 7, shown here as bit line Bj+1. Cell configuration 120 is similar to cell configuration 100 of FIG. 6, except that the source and drain are connected in an opposite fashion. For example, the source can be connected to bit line Bj+1 and the drain can be connected to bit-line Bj. This cell configuration could be used when, for example, the last programmed cell required the opposite connection to that of FIG. 6.

Figure 8:
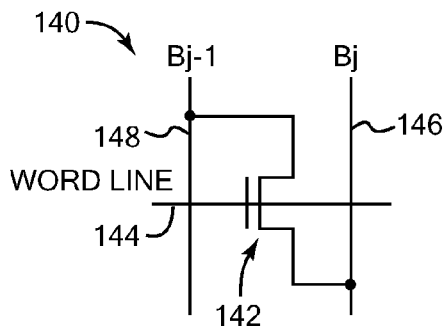
FIG. 8 is a schematic view of a third cell configuration of a memory array of the present invention used to program a zero value.

FIG. 8 is a schematic view of another alternate cell configuration 140 of a memory array of the present invention used to program a zero value. A transistor 142 has a word line 144 connected to the gate of the transistor 142. The source and drain of the transistor 142 are connected between the target bit-line 146 to be read, Bj, and the adjacent bit-line 148 on the left side of the cell 140 in FIG. 8, shown as bit line Bj−1. Cell configuration 140 is similar to cell configuration 100 of FIG. 6, except that the adjacent bit-line is on the left side of the transistor 142 rather than the right side.

Figure 9:
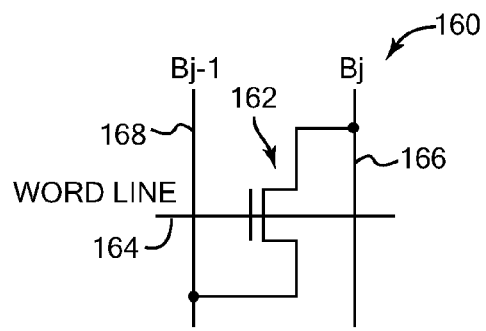
FIG. 9 is a schematic view of a fourth alternate cell configuration of a memory array of the present invention used to program a zero value.

FIG. 9 is a schematic view of another alternate cell configuration 160 of a memory array of the present invention used to program a zero value. A transistor 162 has a word line 164 connected to the gate of the transistor 162. The source and drain of the transistor 162 are connected between the target bit-line 166 to be read, Bj, and the adjacent bit-line 168 on the left side of the cell 160 in FIG. 9, shown as bit line Bj−1. Cell configuration 160 is similar to cell configuration 120 of FIG. 7, except that the adjacent bit-line is on the left side of the transistor 162 rather than the right side.

Figure 10:
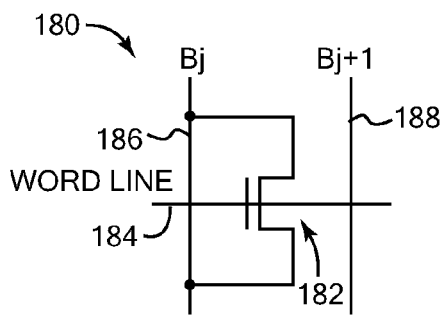
FIG. 10 is a schematic view of a cell configuration of a memory array of the present invention used to program a one value.

FIG. 10 is a schematic view of a cell configuration 180 of a memory array of the present invention used to program a one value. A transistor 182 has a word line 184 connected to the gate of the transistor 182. The source and drain of the transistor 182 are connected together to the target bit-line 186 to be read, Bj, while the adjacent bit-line on the right side 188, Bj+1, is not connected to the transistor 182.

Figure 11:
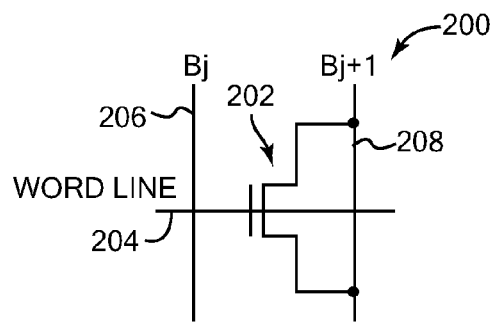
FIG. 11 is a schematic view of a second cell configuration of a memory array of the present invention used to program a one value.
Figure 12:
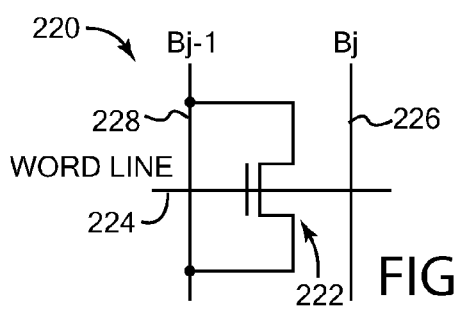
FIG. 12 is a schematic view of a third cell configuration of a memory array of the present invention used to program a one value.

FIG. 11 is a schematic view of an alternate cell configuration 200 of a memory array of the present invention used to program a one value. A transistor 202 has a word line 204 connected to the gate of the transistor 202. The source and drain of the transistor 202 are connected together to a bit-line 208 adjacent on the right side to a target bit-line 206 to be read, Bj, while the target bit-line 206 is not connected. FIG. 12 similarly shows a cell configuration 220 with a transistor 222 and a word line 224, where the source and drain of the transistor 222 are connected together to a bit-line 228 adjacent on the left side to a target bit-line 226 to be read, Bj, while the target bit-line 226 itself is not connected.

Figure 13:
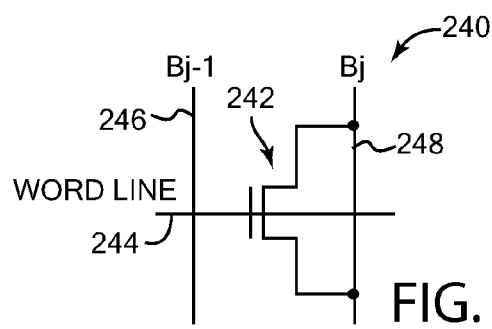
FIG. 13 is a schematic view of a fourth cell configuration of a memory array of the present invention used to program a one value.

Finally, FIG. 13 shows a cell configuration 240 with a transistor 242 and a word line 244 connected to the gate of the transistor 242, where the source and drain of the transistor 242 are connected together to the target bit-line 248 to be read, Bj, on the right side of the transistor. The adjacent bit-line 246 on the left side, Bj−1, is not connected to the transistor 242.

Figure 14:
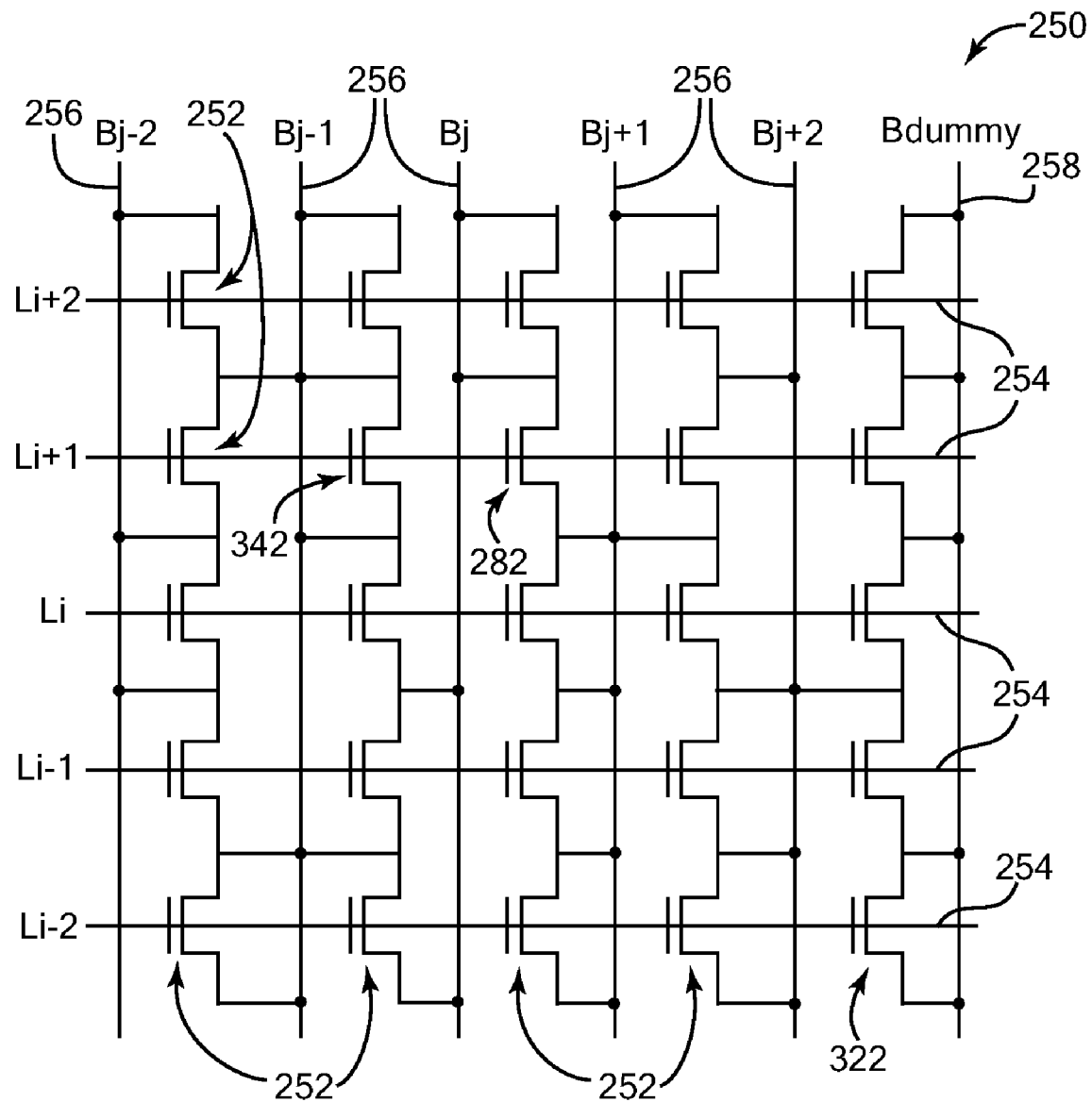
FIG. 14 is a schematic diagram illustrating a high-density non-volatile memory array of the present invention.

FIG. 14 is a schematic diagram illustrating a high-density and robust non-volatile memory array 250 of the present invention, which does not require the use of added reference lines. The data content of array 250 is the same as described above in Table 1.

The array 250 includes a number of cells 252, which are organized in rows and columns. In the example orientation shown, word lines 254 (row lines) are horizontally arranged and each word line connects all the gates of the transistors 252 in that horizontal row. Bit-lines 256 (column lines) are vertically arranged, where each bit-line is connected to one or more sources and/or drains of transistors 252 on either side of the bit-line. The terms "row" and "column" are used herein to designate the arrangement of transistors in an approximate grid, with the connection lines (word lines and bit-lines) approximately parallel to the rows and columns; and the terms "horizontal" and "vertical" are used as terms relative to each other, not as absolute directions. The arrangement of the transistors and lines can be provided in different appropriate orientations in other embodiments.

In the embodiment of FIG. 14, there is one extra column (vertical bit-line) 258, called Bdummy. The dummy bit-line Bdummy is used to assist the programming of the last column of cells in the array, e.g., a column of cells on one edge of the array, and is not used to read any values from cells. In this example, the Bdummy line is located on the right and is used to program the cells on word lines Li−2, Li−1, Li, Li+1 and Li+2 and read by the bit-line Bj+2. In other embodiments, the Bdummy line can be located differently, e.g., on the left side, and used to program different cells than shown in FIG. 14.

Programming each cell 252 is dependent on the last adjacent programmed cell. In the example of FIG. 14, the first bit-line connected to on the left side or right side of the cell is the same bit-line to which the source or drain of the last vertical adjacent programmed cell is connected.

Figure 1:
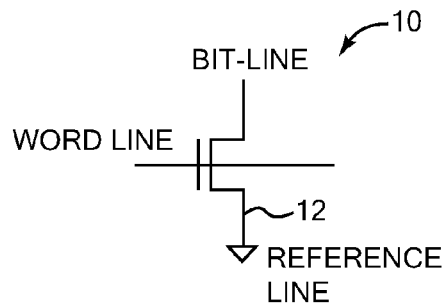
FIG. 1 is a schematic diagram of a classical read-only memory (ROM) cell of the prior art.
Figure 2:
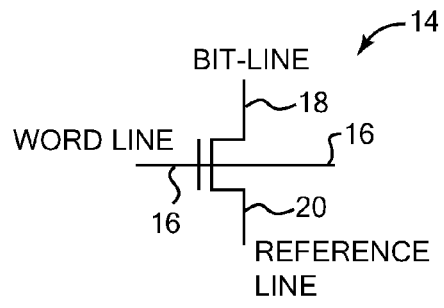
FIG. 2 is a schematic diagram of a memory cell transistor of the prior art.
Figure 3:
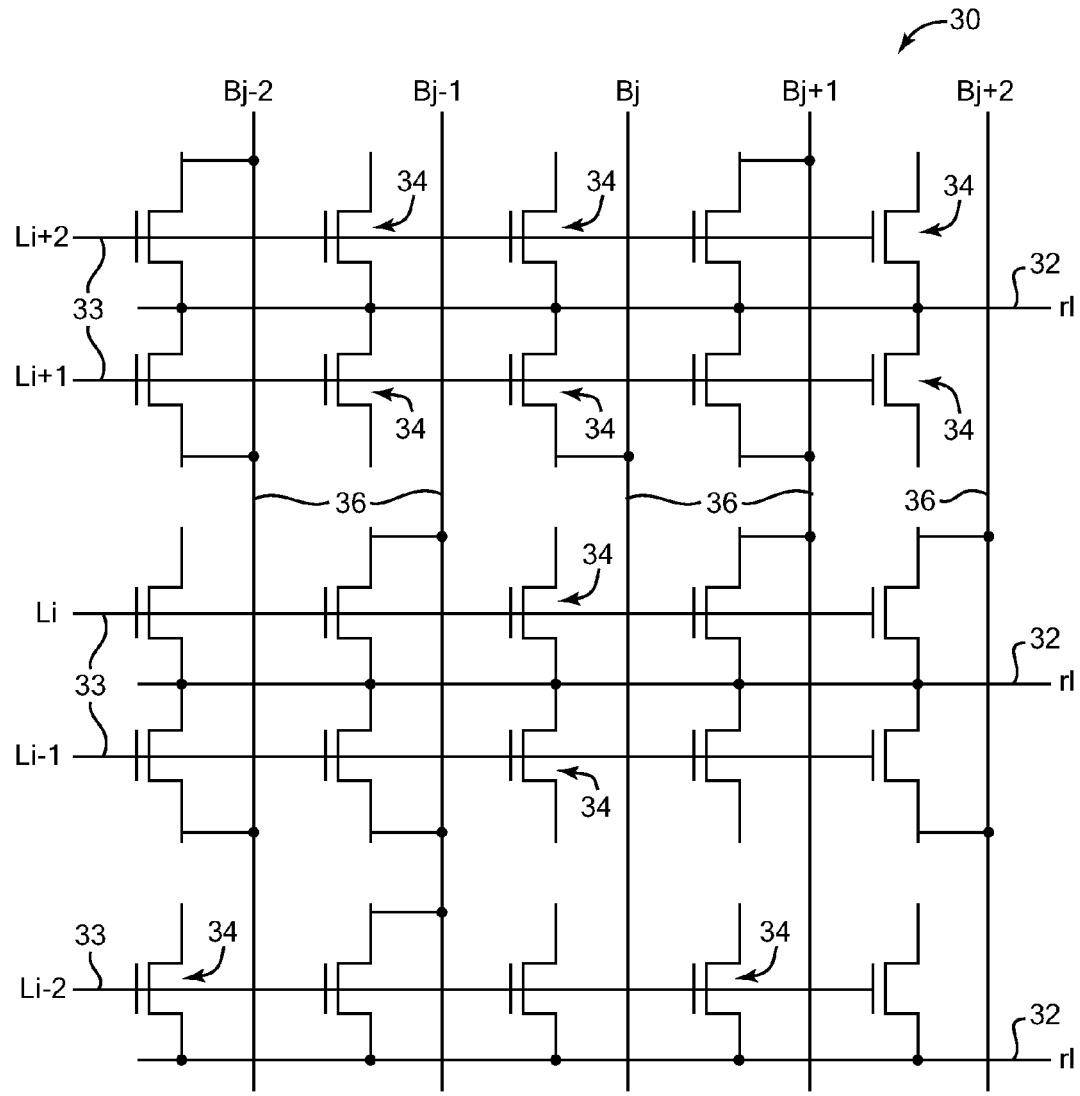
FIG. 3 is a schematic diagram of a ROM array having horizontal reference lines parallel to horizontal word lines.
Figure 4:
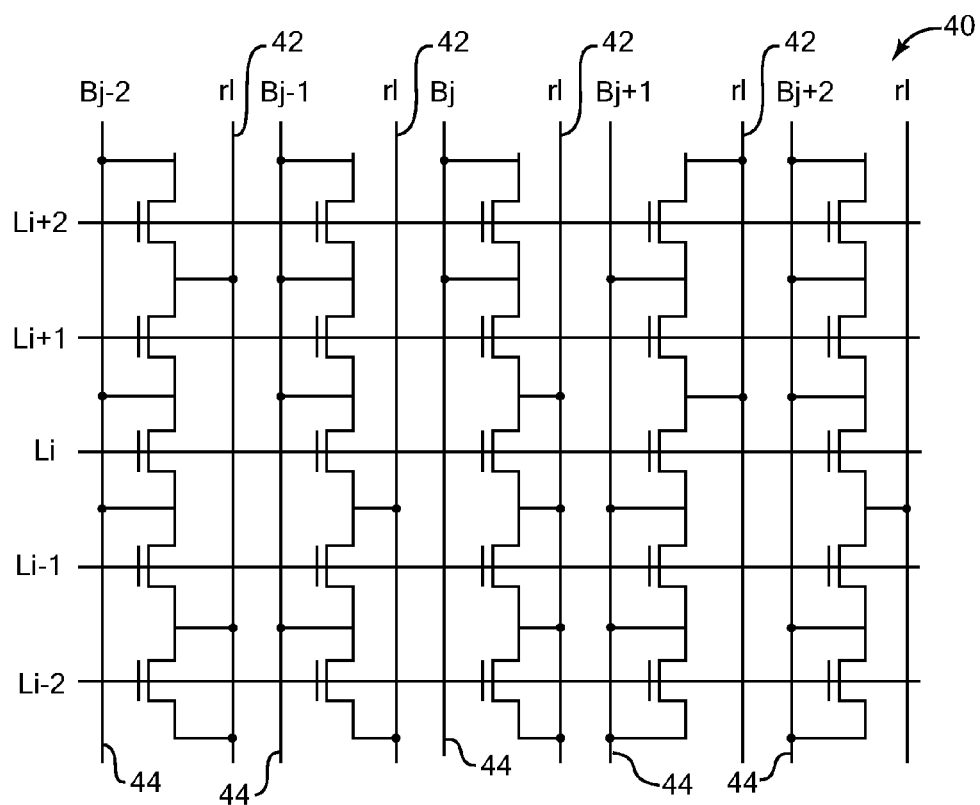
FIG. 4 is a schematic diagram of a first prior art design of a memory array having vertical bit-lines and reference lines.
Figure 5:
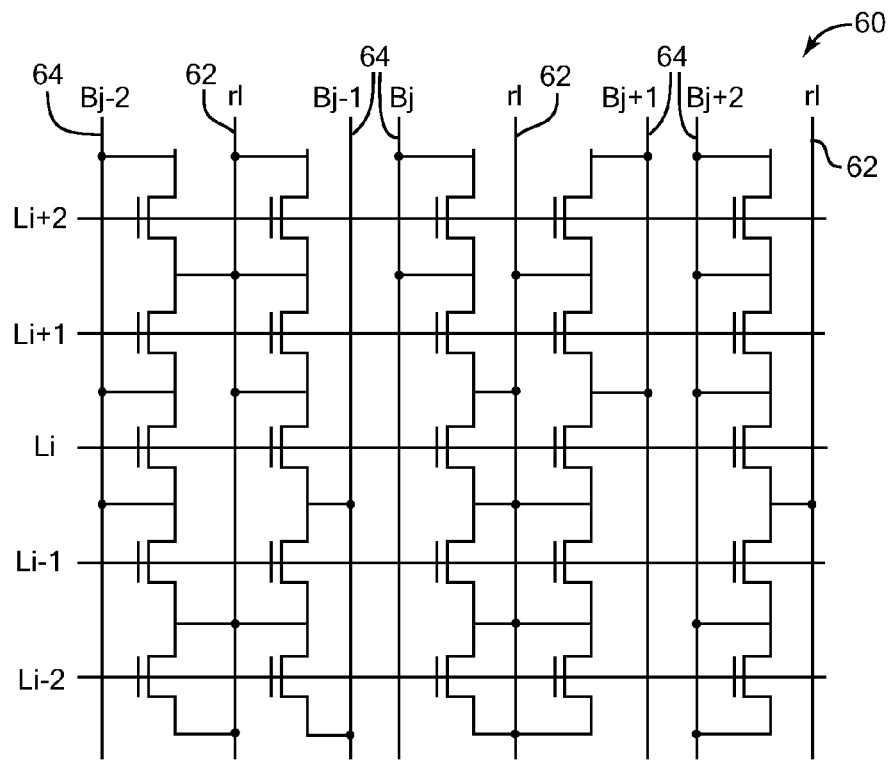
FIG. 5 is a schematic diagram of a second prior art design of a memory array having vertical bit-lines and reference lines.

Thus, in memory array 250, each bit-line 256 is shared between two cells 252 and each cell is connected by its source and drain to one or two different bit-lines 256, where each cell has one word line 254 connected to its gate. There are no reference lines needed in the memory array 250, thus reducing considerably the physical area required to implement the memory array. In comparison to the use of vertical reference lines, as in the prior art, the present invention requires smaller area since there is only one additional column line (a dummy bit-line) for the entire array, regardless of the number of bit-lines used. Other solutions, in contrast, require n additional reference lines for n bit-lines in the array (FIG. 4), or n/2 additional reference lines for n bit-lines in the array (FIG. 5). In comparison to prior horizontal reference-line ROM cells (FIG. 3), the present invention requires smaller area since there is no additional line needed to deal with active/diffusion resistance nor additional area needed for metal reference lines, and there is no need for an additional reference line for every two word lines.

The memory array 250 stores data in the individual cells 252, which can be read by performing a reading operation. In the examples described below with respect to FIGS. 15-26, the data from a single target cell is read for explanatory purposes. More generally, data can be read from multiple target cells of the array 250 at the same time or close in time. Thus, for example, a target word line can be set to select a particular row of cells and the selected bit lines associated with all the target cells can be set appropriately, and the data in multiple target cells of that row can be read simultaneously from all the target bit-lines connected to those target cells.

Figure 15:
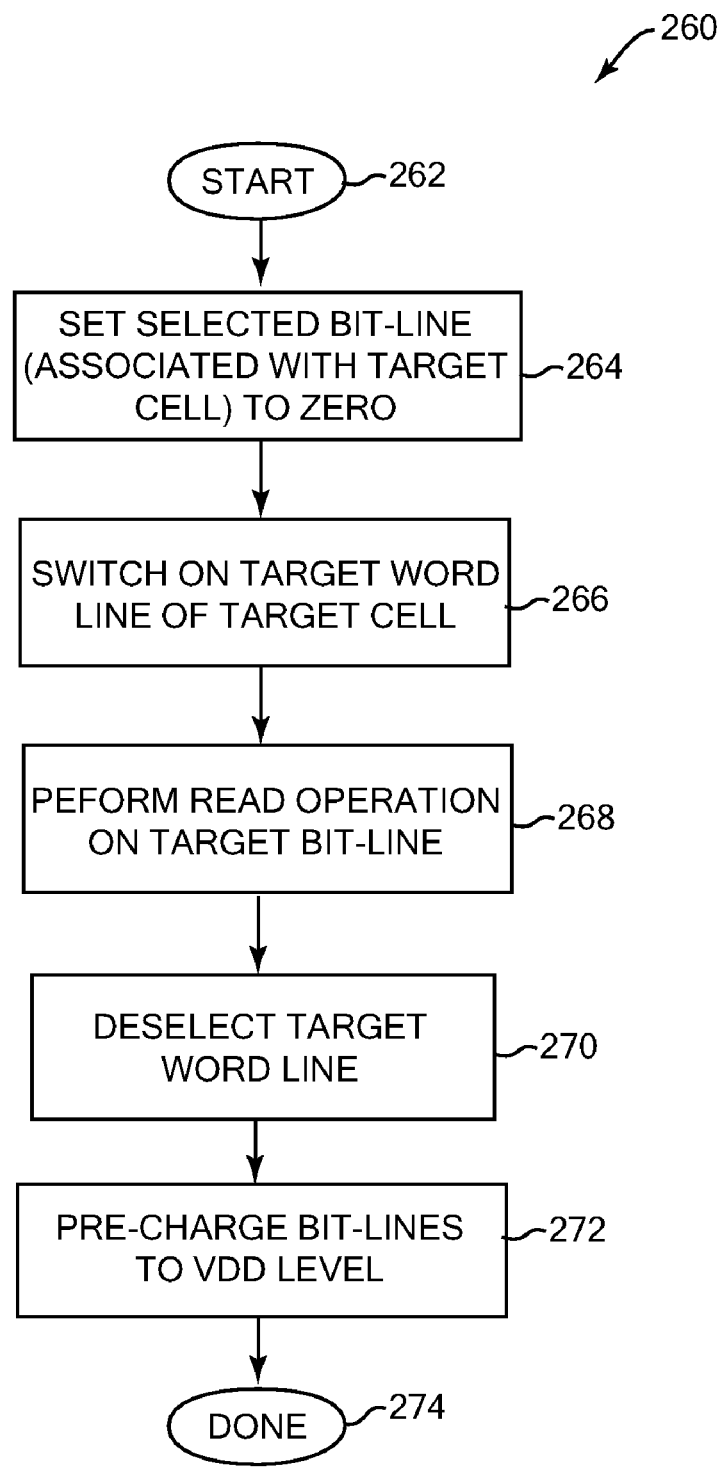
FIG. 15 is a flow diagram illustrating a method of reading data stored in the memory array of FIG. 14.

FIG. 15 is a flow diagram illustrating a method 260 of reading data stored in the memory array 250 of FIG. 14. The method 260 (and the other methods described herein) can be performed and/or be controlled by program code implemented by a computer and stored on a computer readable medium (e.g., semiconductor or solid state memory, magnetic disk, optical disk, electromagnetic storage, etc.), or using hardware (e.g., logic gates, etc.), or by a combination of hardware and software.

The reading operation described in FIG. 15 makes basic assumptions, including the following. Each cell 252 is programmed, depending on the content of the cell, between a target bit-line 256 and the bit-line adjacent to the target bit line on the other side of the cell; e.g., in FIG. 14, the target bit line is to the left of the cell and the adjacent bit-line is to the right of the cell. The cell is programmed between bit-lines j and j+1 according to the desired value as described above with reference to FIGS. 6-13. (The data stored by the target cell is to be read from the target bit-line.)

In addition, all the bit-lines 256 of the memory array 250 (including Bdummy) are pre-charged to a standby voltage equivalent to a one value, e.g., a voltage Vdd, and all the word lines 254 are set to zero. Thus, all the cells of the array 250 are switched off. This can be the state of the memory array when the array is in standby mode, such as when there is no read operation yet to be performed. Because all the bit-lines 256 are set to Vdd, the drain-source voltage Vds equals zero for each cell 252, and there is no sub threshold leakage current in the array 250. Thus the memory array 250 has a reduced leakage current during standby mode. In other embodiments, standby mode can be set all the bit-lines to zero (ground), or to high impedance (floating) (see the examples described below). More generally, all the bit-lines are provided at the same potential or floating before the reading operation begins. Herein, when the bit-lines are referred to being charged to, or at, an "opposite level" to another bit-line or voltage level (potential), this is referring to either a one ("1") level that is opposite to a zero voltage level, or a zero voltage level that is opposite to a one level. Furthermore, in the examples of FIGS. 15-26, one target cell is being read from one target bit-line. In other embodiments, multiple target cells can be read from multiple target bit-lines.

The method for a reading operation begins at 262, and in step 264, the selected bit-line adjacent to the target bit-line on the other side of the target cell (e.g., on the right of the bit-line in FIG. 14) is then set to zero, and will remain at zero during the read operation, as described below. This setting of the adjacent bit-line to zero either causes a discharge on the target bit-line if a zero value is stored by the target cell, or does not cause a (full) discharge if a one value is stored by the target cell, because the target cell is not connected to the adjacent bit line in such a case. In step 266, the target cell which is desired to be read is switched on by selecting the target word line associated with the target cell and switching on that word line to the Vdd value. In step 268, the read operation is performed using the target bit-line, where the target bit-line is in high impedance during the entire read operation. For example, a sense amplifier corresponding to the selected cell is activated and reads the stored value on the target bit-line. In step 270, after the read operation is complete, the target word line is deselected (set to zero). In step 272, the pre-charge of all bit-lines (or of only the discharged bit-lines) is started so that all the bit-lines will be back at the Vdd level and ready for another read operation. The method is then complete at 274.

Figure 16:
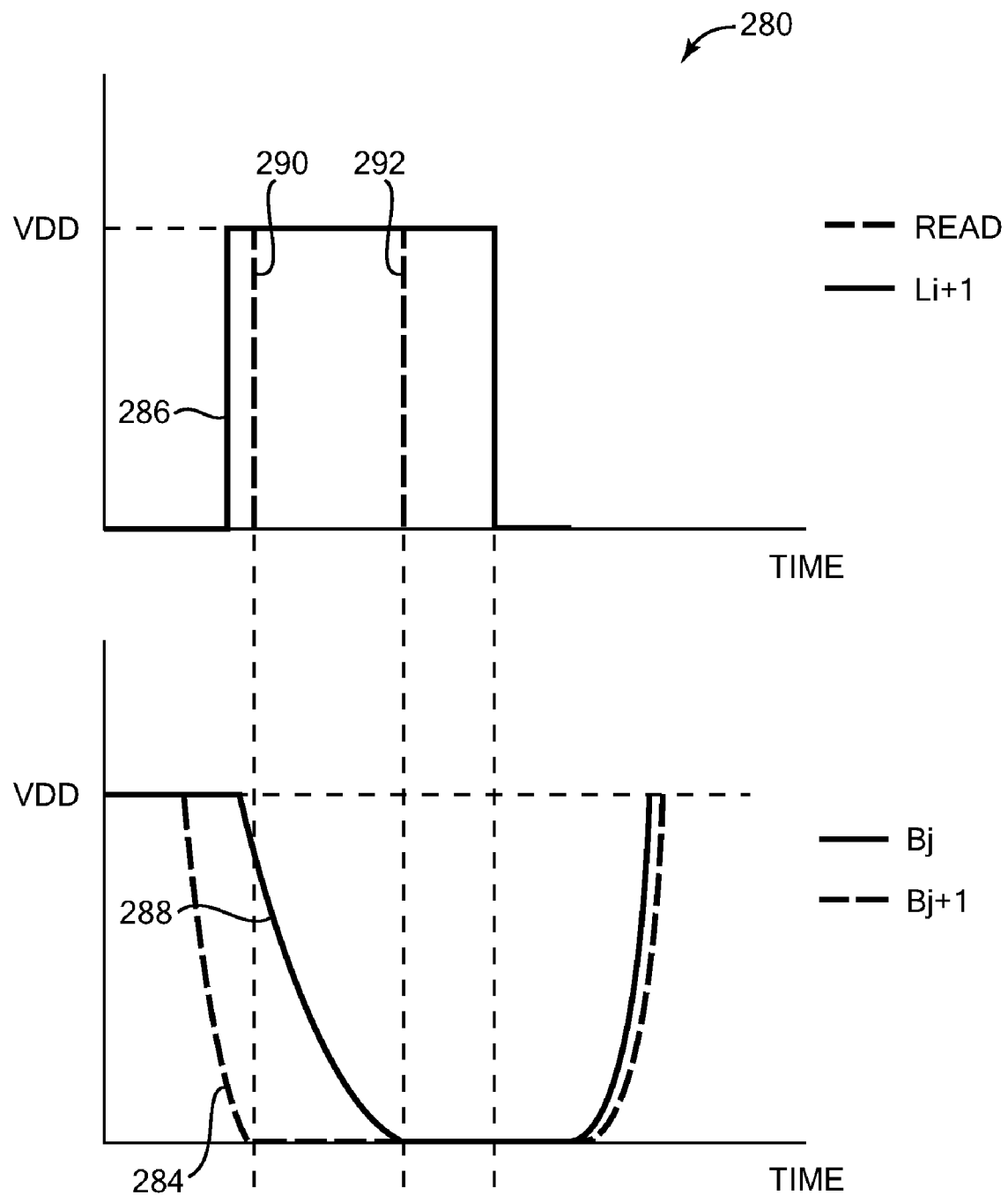
FIG. 16 is a graph illustrating a first example of a reading operation using the memory array of FIG. 14.

FIG. 16 is a graph 280 illustrating a first example of the reading operation using the memory array 250. In this example, the zero value stored at cell 282 in FIG. 14, is to be read using bit-line Bj and word line Li+1. All the bit-lines in the array 250 are assumed to be pre-charged to the Vdd voltage. First, the bit-line Bj+1 is set to zero voltage; all bit-lines are thus in high impedance except bit-line Bj+1. The discharging of bit-line Bj+1 is shown in graph 280 by the Bj+1 curve 284 falling from the Vdd level.

Next, the target word line Li+1 is switched on. The Li+1 curve 286 shown in graph 280 shows this switching from the 0 value to the Vdd value as Li+1 is selected. After Li+1 is switched on, the selected cell transistor 282 begins to discharge the bit-line Bj, and the sense amplifier corresponding to the selected cell is activated. The discharge of bit-line Bj is indicated in graph 280 by the Bj curve 288 falling from the Vdd level.

After the discharging of bit-line Bj, the read operation is started; this is indicated in graph 280 with the first, rising edge shown by read operation curve 290. Meanwhile, the bit-line Bj continues to discharge, until it reaches the 0 voltage level. At this point, the trip point of the corresponding sense amplifier has been reached by Bj, and the sense amplifier reads a zero value on bit-line Bj. The reading operation is then ended, as indicated by the falling edge shown by read operation line 292. After the read operation is complete, then the Li+1 line can be deselected and set back to the zero voltage level; this is shown in graph 280 by the Li+1 curve 286 falling to the zero voltage level after the read operation is ended (i.e., after the curve 292). Finally, the pre-charge of bit-lines is started so that all the bit-lines will be back at the Vdd level, as indicated by curves 284, 288, and 296 rising after the Li+1 line was deselected.

Figure 17:
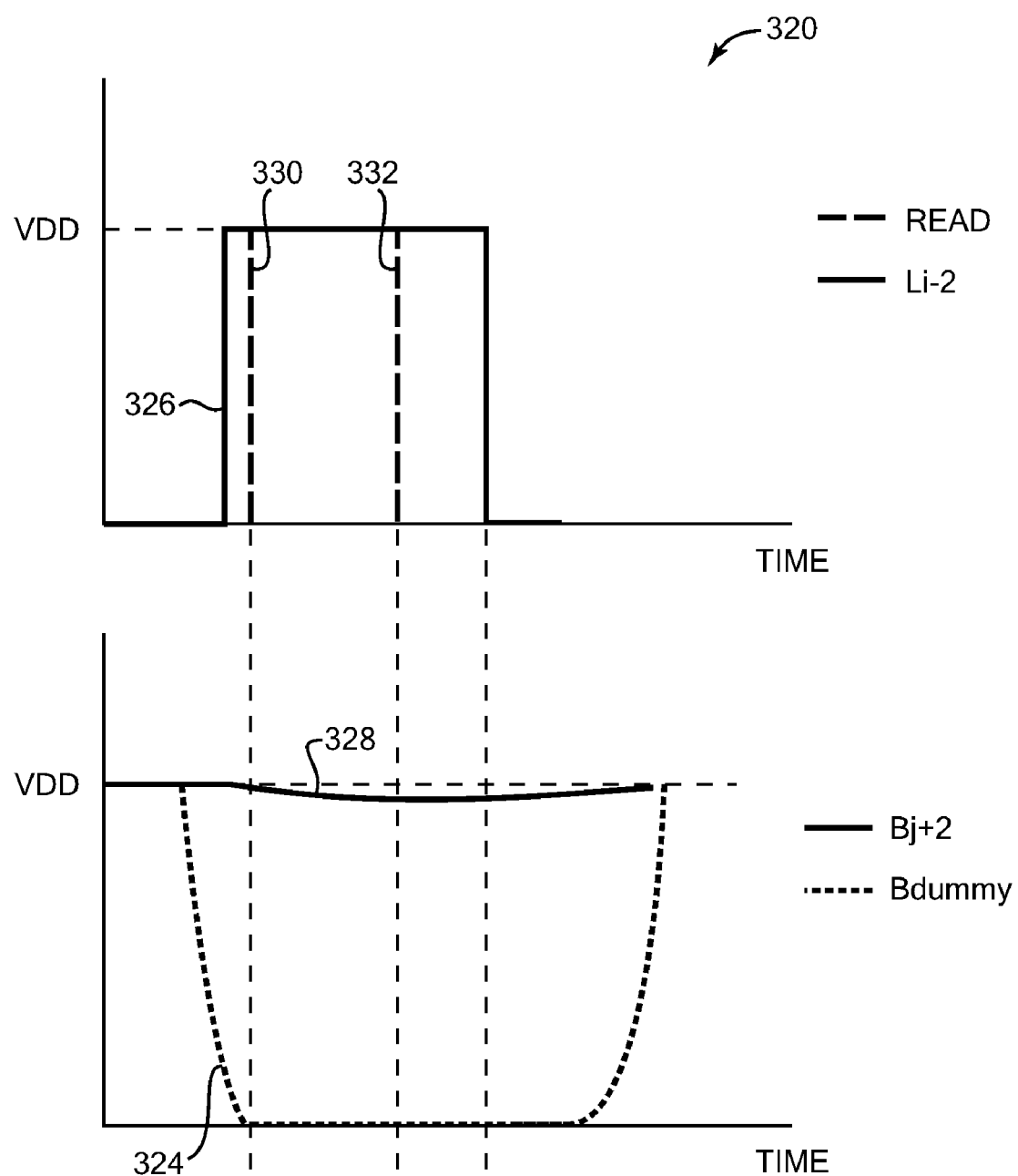
FIG. 17 is a graph illustrating a second example of a reading operation using the memory array of FIG. 14.

FIG. 17 is a graph 320 illustrating a second example of the reading operation using the memory array 250. In this example, the one value stored at cell 322 in FIG. 14, is to be read using bit-line Bj+2 and word line Li−2. All the bit-lines in the array 250 are assumed to be pre-charged to the Vdd voltage. First, the bit-line Bdummy is set to zero voltage; all bit-lines are thus in high impedance except bit-line Bdummy. The discharging of bit-line Bdummy is shown in graph 320 by the Bdummy curve 324 falling from the Vdd level.

Next, the target word line Li−2 is switched on. The Li−2 curve 326 shown in graph 320 shows this switching from the 0 value to the Vdd value as line Li−2 is selected. After Li−2 is switched on, the sense amplifier corresponding to the selected target cell is activated. However, since both source and drain of the selected cell transistor 322 are not connected to bit-line Bj+2, but instead are connected to bit-line Bdummy, bit-line Bj+2 does not appreciably discharge, as shown by Bj+2 curve 328 in graph 320.

After the target word line Li−2 is selected, the read operation is started; this is indicated in graph 320 with the rising edge shown by read operation curve 330. The bit-line Bj+2 maintains at approximately the Vdd level, and the corresponding-sense amplifier reads a one value on line Bj+2. The reading operation is then ended, as indicated by the falling edge shown by read operation line 332. The Li−2 word line can then be deselected and set back to the zero voltage level, as shown in graph 320 by the Li−2 curve 326 falling to the zero voltage level after the read operation is ended (i.e., after curve 332). Finally, the pre-charge of bit-line(s) is started so that the bit-lines will be back at the Vdd level, as indicated by Bdummy curve 324 rising after the Li−2 line was deselected.

Figure 18:
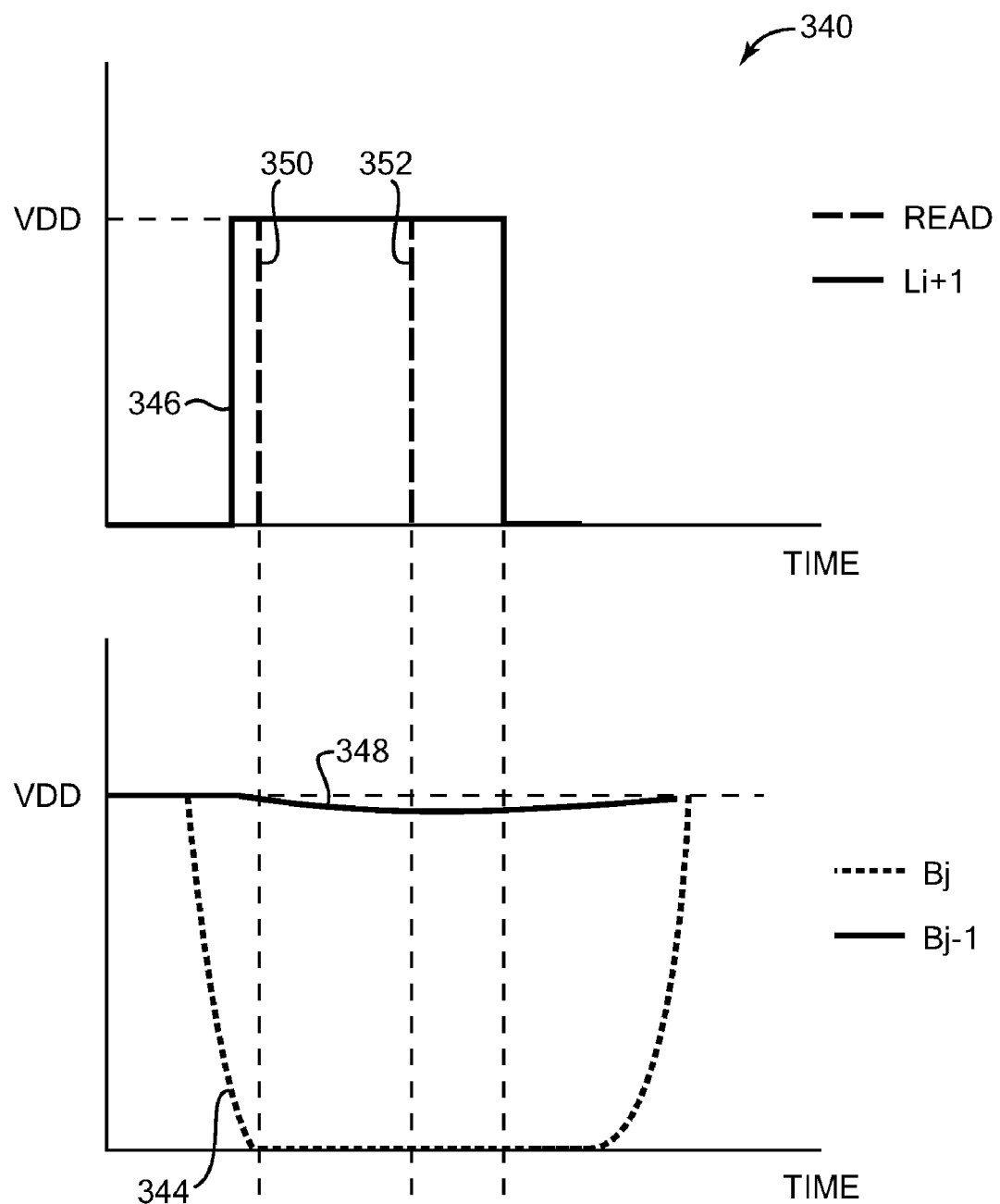
FIG. 18 is a graph illustrating a third example of a reading operation using the memory array of FIG. 14.

FIG. 18 is a graph 340 illustrating a third example of the reading operation using the memory array 250. In this example, the one value stored at cell 342 in FIG. 14, is to be read using bit-line Bj−1 and word line Li+1. All the bit-lines in the array 250 are assumed to be pre-charged to the Vdd voltage. First, the bit-line Bj is set to zero voltage, so that all bit-lines are in high impedance except bit-line Bj. The discharging of bit-line Bj is shown in graph 340 by the Bj curve 344 falling from the Vdd level.

Next, the target word line Li+1 is switched on, as shown by Li+1 curve 346 moving from the 0 value to the Vdd value as line Li+1 is selected. After Li+1 is switched on, the sense amplifier corresponding to the selected target cell is activated. However, since both source and drain of the selected cell transistor 342 are connected to the same bit-line Bj−1, the bit-line Bj−1 does not appreciably discharge, as shown by Bj−1 curve 348 in graph 340.

After the target word line Li+1 is selected, the read operation is started; this is indicated in graph 340 with the rising edge shown by read operation curve 350. The bit-line Bj−1 maintains at approximately the Vdd level, and the corresponding sense amplifier reads a one value on line Bj−1. The reading operation is then ended, as indicated by the falling edge shown by read operation line 332. The Li+1 word line can then be deselected and set back to the zero voltage level; this is shown in graph 340 by the Li+1 curve 346 falling to the zero voltage level after the read operation is ended (i.e., after curve 352). Finally, the pre-charge of bit-lines is started so that the bit-lines will be back at the Vdd level, as indicated by Bj curve 344 rising after the Li+1 line was deselected.

Additional Reading Operation Examples

Methods similar to the method of FIG. 15 can be used in other embodiments, with the bit-lines set to other voltages or high impedance in standby mode, or with an inverted memory array 250. It should be noted that in some of these examples, the target bit-line to be read is set to a different potential than the standby potential of all the bit-lines in standby mode. The potential that is set on a target bit-line to be read is referred to below as a "reading potential."

In one embodiment, all the bit-lines of the memory array 250 (including Bdummy) are set to a standby potential or to high impedance (floating), and all the word lines 254 are set to zero. This can be the state of the memory array when the array is in standby mode.

FIG. 19 is a flow diagram illustrating a method 400 in which all the bit-lines are in high impedance in standby mode. The method begins at 402, and in step 404, the selected bit-line adjacent to the target bit-line on the other side of the target cell (e.g., on the right of the bit-line in FIG. 14) is set to zero, and will remain at zero during the read operation. Furthermore, the target bit-line is precharged to a reading potential value of "1" (e.g., Vdd) In step 406, the target cell which is desired to be read is switched on by selecting the target word line associated with the target cell and switching on that word line to the Vdd value. In step 408, the read operation is performed using the target bit-line, e.g., a sense amplifier corresponding to the selected cell is activated and reads the stored value on the target bit-line. In step 410, after the read operation is complete, the target word line is deselected (set to zero). All bit lines are then set back to floating in step 412. The method is then complete at 414.

For a first example similar to the example FIG. 16, the zero value stored at cell 282 in the array of FIG. 14 is to be read using bit-line Bj and word line Li+1. All the bit-lines in the array 250 are assumed to be floating. First, the bit-line Bj+1 is set to zero voltage and kept at zero voltage during the entire read operation. Also, bit-line Bj is precharged to Vdd. Next, the target word line Li+1 is switched on, and then the selected cell transistor 282 begins to discharge the bit-line Bj, and the corresponding sense amplifier is activated. After the discharging of bit-line Bj, the read operation is started; after a 0 voltage level, the trip point of the sense amplifier is reached and the sense amplifier reads a zero value on bit-line Bj. The reading operation is then ended, the Li+1 line is deselected, and all bit lines are set to floating.

The second and third examples of FIG. 17 and FIG. 18 proceed similarly when using the method of FIG. 19, with all bit-lines initially set to floating, precharging the target bit line and setting the associated bit-line to one, switching on the target word line, reading the value with the sense amplifier, deselecting the word line, and setting all the bit-lines back to floating.

In a different embodiment, all the bit-lines of the memory array 250 (including Bdummy) are set to a zero voltage in standby mode, and all the word lines 254 are set to zero.

FIG. 20 is a flow diagram illustrating a method 420 in which all the bit-lines are set to a standby potential of zero voltage in standby mode. The method begins at 422, and in step 424, the target bit-line is precharged to a reading potential value of "1" (e.g., Vdd). The selected bit-line adjacent to the target bit-line on the other side of the target cell (e.g., on the right of the bit-line in FIG. 14) is kept at zero, and will remain at zero during the read operation. In step 426, the target cell which is desired to be read is switched on by selecting the target word line associated with the target cell and switching on that word line to the Vdd value. In step 428, the read operation is performed using the target bit-line. In step 430, after the read operation is complete, the target word line is deselected (set to zero). In step 432, all the bit-lines are set back to zero voltage. The method is then complete at 434.

For a first example similar to the example FIG. 16, the zero value stored at cell 282 in FIG. 14 is to be read using bit-line Bj and word line Li+1. All the bit-lines in the array 250 are set to, or are assumed to be at, zero voltage. First, bit-line Bj is precharged to Vdd. Next, the target word line Li+1 is switched on, and then the selected cell transistor 282 begins to discharge the bit-line Bj, and the corresponding sense amplifier is activated. The sense amplifier reads a zero value on bit-line Bj when the amplifier's trip point is reached. The reading operation is then ended, and the Li+1 line is deselected. The bit lines are then all set back to zero voltage.

The second and third examples of FIG. 17 and FIG. 18 proceed similarly when using the method of FIG. 20, with all bit-lines initially set to zero, precharging the target bit line, switching on the target word line, reading the value with the sense amplifier, deselecting the word line, and setting all the bit-lines back to zero voltage.

Figure 21:
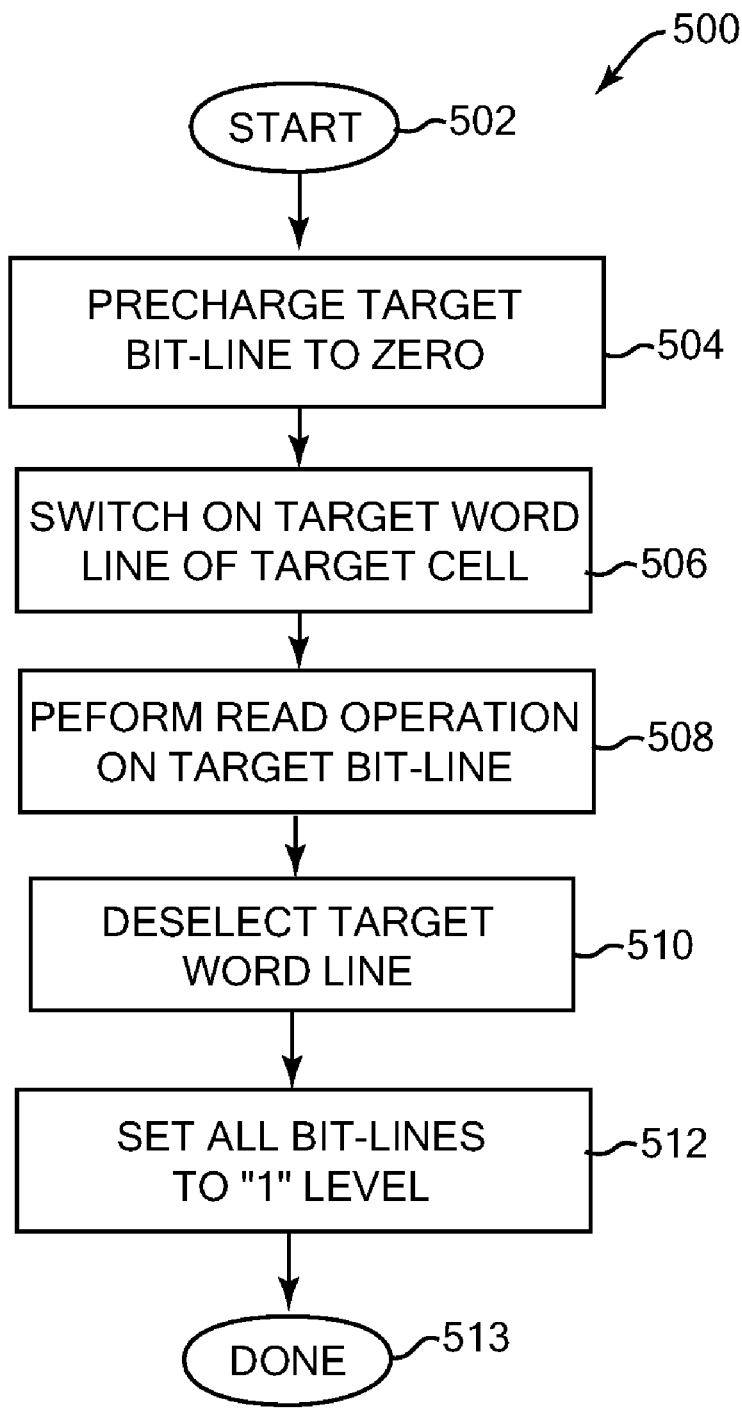
FIG. 21 is a flow diagram illustrating a method of reading data stored in an inverted memory array of FIG. 14 when bit lines are precharged to a "1" value.
Figure 22:
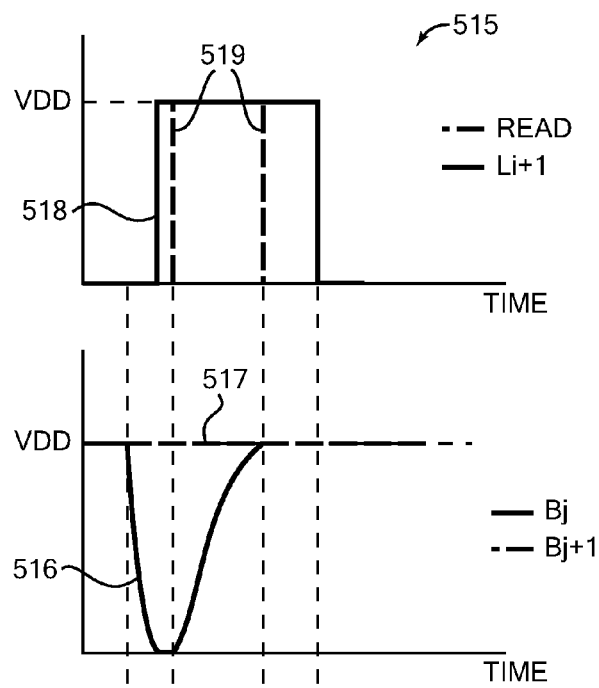
FIG. 22 is a graph illustrating the first example for a reading operation of FIG. 21 using an inverted memory array of FIG. 14.
Figures 23, 24:
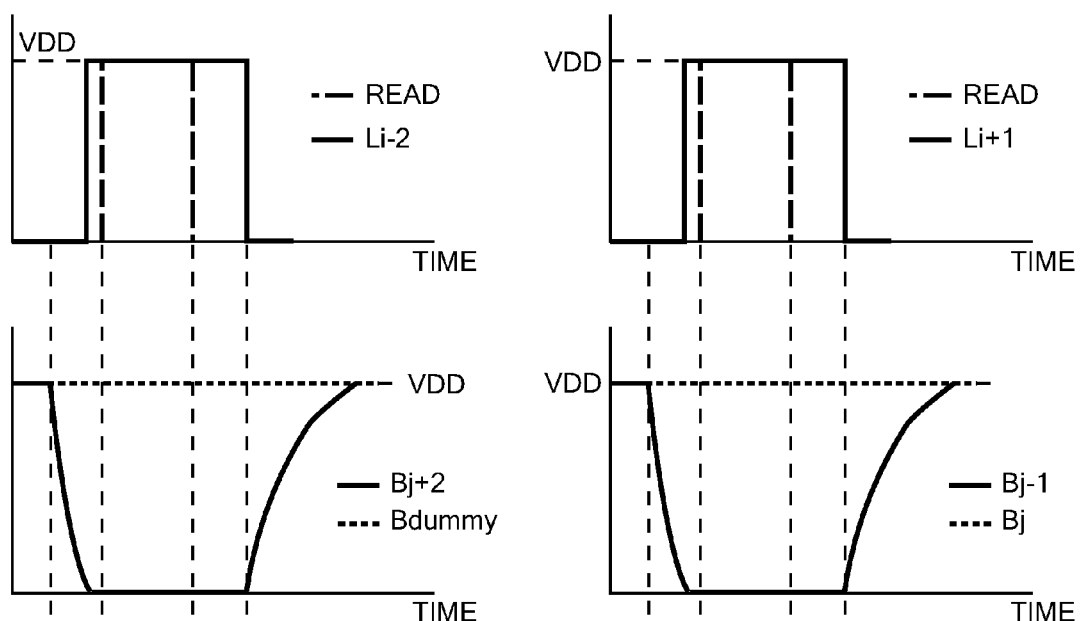
FIG. 23 is a graph illustrating the second example for a reading operation of FIG. 21 using an inverted memory array of FIG. 14.
FIG. 24 is a graph illustrating the third example for a reading operation of FIG. 21 using an inverted memory array of FIG. 14.

In a different embodiment, the programming of the memory array 250 is inverted. Thus, to program a "0" value, the source and drain of the cell are connected together to the target bit-line to be read, or to the cell's neighbor on the right or on the left. To program a "1" value, the source and drain of the cell are connected between the target bit-line to be read and to the cell's neighbor on the right side or the left side (Bj−1). FIGS. 21-23 illustrate methods of reading a target bit-line for an inverted memory array.

FIG. 21 is a flow diagram illustrating a method 500 in which all the bit-lines are set to a "1" voltage (e.g., Vdd) in standby mode. The method begins at 502, and in step 504, the target bit-line is set to a reading potential value of "0". The selected bit-line adjacent to the target bit-line on the other side of the target cell (e.g., on the right of the bit-line in FIG. 14) is kept at "1", and will remain at "1" during the read operation. In step 506, the target cell which is desired to be read is switched on by selecting the target word line associated with the target cell and switching on that word line to the Vdd value. In step 508, the read operation is performed using the target bit-line. In step 510, after the read operation is complete, the target word line is deselected. All bit lines are then charged back to 1 in step 512, and the method is complete at 513.

FIG. 22 is a graph 515 illustrating a first example similar to the example of FIG. 16. A "1" value is stored at cell 282 in an inverted array similar to the array of FIG. 14 (instead of zero value), due to the array being inverted. This "1" value is to be read using bit-line Bj and word line Li+1. All the bit-lines in the array 250 are set to a "1" value. First, bit-line Bj is set to zero, as shown in graph 515 by the Bj curve 516 falling from the Vdd level (Bj+1 curve 517 is kept at "1"). Next, the target word line Li+1 is switched on as shown by curve 518, and the corresponding sense amplifier reads a "1" value on bit-line Bj when the amplifier's trip point is reached, when the read operation curve 519 is at Vdd. The reading operation is then ended and curve 519 falls to zero, and the Li+1 line is deselected as shown by curve 518. The bit lines are then all set back to a "1" value.

Second and third examples similar to the examples of FIG. 17 and FIG. 18 but using the method of FIG. 21 are illustrated in FIGS. 23 and 24. A zero value is read on the target bit-line instead of a one value due to the inverted array. The operation proceeds similarly when using the method of FIG. 21, with all bit-lines initially set to "1", precharging the target bit line to zero, switching on the target word line, reading the value with the sense amplifier, deselecting the word line, and setting all the bit-lines back to a "1" value.

Figure 25:
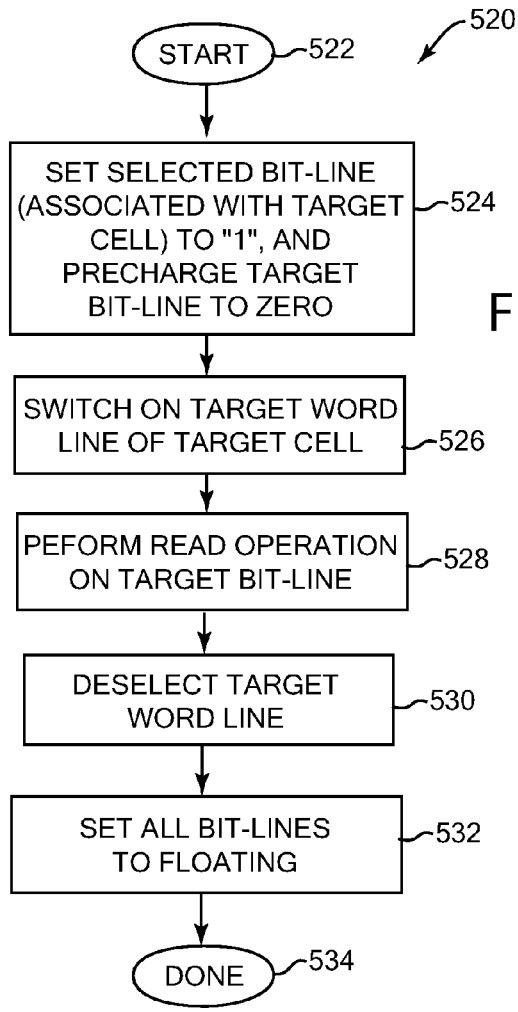
FIG. 25 is a flow diagram illustrating a method of reading data stored in an inverted memory array of FIG. 14 when bit-lines are floating.

FIG. 25 is a flow diagram illustrating a method 520 in which all the bit-lines are in high impedance (floating) in standby mode. The method begins at 522, and in step 524, the selected bit-line adjacent to the target bit-line on the other side of the target cell (e.g., on the right of the bit-line in FIG. 14) is set to "1", and will remain at "1" during the read operation. Also, the target bit-line is set to a reading potential of zero. In step 526, the target cell which is desired to be read is switched on. In step 528, the read operation is performed using the target bit-line. In step 530, after the read operation is complete, the target word line is deselected. All bit lines then set back to floating in step 532, and the method is complete at 534.

For a first example similar to the example of FIG. 22 but using the method of FIG. 25, a "1" value is stored at cell 282 in FIG. 14 which is to be read using bit-line Bj and word line Li+1. All the bit-lines in the inverted array 250 are floating. First, bit-line Bj is set to zero and bit-line Bj+1 is set to "1" and kept at "1" during the read operation. Next, the target word line Li+1 is switched on, and the corresponding sense amplifier reads a "1" value on bit-line Bj when the amplifier's trip point is reached. The reading operation is then ended, and the Li+1 line is deselected. The bit lines are then all set back to floating. Second and third examples can be similar to the examples of FIGS. 23 and 24, respectively, in which a zero value is read, and proceed according to the method of FIG. 25.

Figure 26:
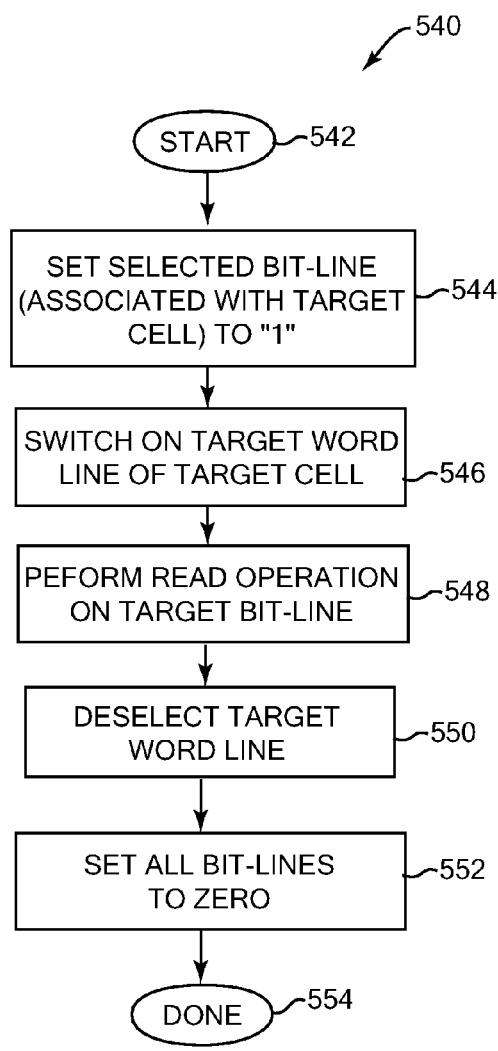
FIG. 26 is a flow diagram illustrating a method of reading data stored in the memory array of FIG. 14 when bit lines are precharged to zero voltage.

FIG. 26 is a flow diagram illustrating a method 540 in which all the bit-lines are set to a standby potential of zero in standby mode. The method begins at 542, and in step 544, the selected bit-line adjacent to the target bit-line on the other side of the target cell (e.g., on the right of the bit-line in FIG. 14) is set to "1," and will remain at "1" during the read operation. In step 546, the target cell which is desired to be read is switched on. In step 548, the read operation is performed using the target bit-line. In step 550, after the read operation is complete, the target word line is deselected. In step 552, all the bit-lines are set back to the standby potential zero value. The method is then complete at 554.

For a first example similar to the example of FIG. 22 but using the method of FIG. 26, a "1" value is stored at cell 282 in FIG. 14 which is to be read using bit-line Bj and word line Li+1. All the bit-lines in the inverted array 250 are set to "0". First, bit-line Bj+1 is set to "1" and kept at "1" during the read operation. Next, the target word line Li+1 is switched on, and the corresponding sense amplifier reads a "1" value on bit-line Bj when the amplifier's trip point is reached. The reading operation is then ended, and the Li+1 line is deselected. The bit lines are then all set back to floating. Second and third examples can be similar to the examples of FIGS. 23 and 24, respectively, in which a zero value is read, proceed according to the method of FIG. 26.

In general the reading operation is performed once the target bit-line is precharged to the "reading potential" and the selected bit-line is set to the opposite potential of the reading then the target cell is activated.

Although the present invention has been described in accordance with the embodiments shown, one of ordinary skill in the art will readily recognize that there could be variations to the embodiments and those variations would be within the spirit and scope of the present invention. For example, although the present invention has been described generally in the context of a voltage sensing scheme, one of ordinary skill in the art recognizes a current sensing scheme could be utilized and that would be within the spirit and scope of the present invention. Accordingly, many modifications may be made by one of ordinary skill in the art without departing from the spirit and scope of the appended claims.

What is claimed is:

1. A memory array circuit comprising:
   a plurality of word lines including a first word line and a second word line;
   a plurality of bit-lines; and
   a plurality of memory cell transistors including:
      a first memory cell transistor and a second memory cell transistor, wherein the first and second memory cell transistors include gates connected to the first word line, the first memory cell transistor includes a source connected to the first bit-line and a drain connected to the second bit-line, and the second memory cell transistor includes a source connected to the first bit-line and a drain connected to the first bit-line; and
      a third memory cell transistor and a fourth memory cell transistor, wherein the third and fourth memory cell transistors include gates connected to the second word line, the third memory cell transistor includes a drain connected to the first bit-line and a source connected to the second bit-line, and the fourth memory cell transistor includes a source connected to the first bit-line and a drain connected to the first bit-line.

2. The memory array circuit of claim 1 wherein the memory cell transistors implement a non-volatile memory array.

3. The memory array circuit of claim 1 wherein each memory cell transistor of the plurality of memory cell transistors is configured to store and provide reading access to a one value and a zero value using only the word lines and bit-lines.

4. The memory array circuit of claim 1 wherein no reference lines are provided in the memory array circuit for use with the memory cell transistors.

5. The memory array circuit of claim 1 wherein the memory cell transistors are aligned in approximately linear rows and columns, wherein only one bit-line of the plurality of bit lines is provided between two of the columns.

6. The memory array circuit of claim 1 further comprising a single dummy bit-line to which a drain or a source of one or more of the memory cell transistors is connected.

7. The memory array circuit of claim 6 wherein the dummy bit-line is provided adjacent to an edge column of the memory cell transistors in the memory array circuit and is used in the programming of at least one of the memory cell transistors in the edge column.

8. The memory array circuit of claim 1 wherein each bit-line of the plurality of bit-lines is approximately parallel to columns of the memory cell transistors, and wherein a total number of the columns is less than a number of the plurality of bit-lines plus one additional dummy bit line.

9. The memory array circuit of claim 2 wherein the bit-lines are set to a same potential or to high impedance during standby mode when no reading operation is performed.

10. The memory array circuit of claim 1 wherein each memory cell transistor of the plurality of memory cell transistors is configured to store and provide reading access to a one value and a zero value using only the word lines and bit-lines, and wherein no reference lines are provided in the memory array circuit for use with the memory cell transistors.

11. The memory array circuit of claim 1 is used to program at least one of the selected memory cell transistors.

12. The memory array circuit of claim 1 wherein the first and second memory cell transistors are located at different memory cell columns of the memory circuit array.

13. The memory array circuit of claim 1 wherein the first and second memory cell transistors implement read-only-memory (ROM) cells.

* * * * *

UNITED STATES PATENT AND TRADEMARK OFFICE
CERTIFICATE OF CORRECTION

PATENT NO. : 7,684,244 B2
APPLICATION NO. : 11/749428
DATED : March 23, 2010
INVENTOR(S) : Salwa B. Alami et al.

It is certified that error appears in the above-identified patent and that said Letters Patent is hereby corrected as shown below:

In column 14, line 16, in Claim 11, before "memory" delete "selected".

Signed and Sealed this

Twenty-fifth Day of May, 2010

David J. Kappos
*Director of the United States Patent and Trademark Office*